(12) United States Patent
Shin et al.

(10) Patent No.: US 11,735,443 B2
(45) Date of Patent: Aug. 22, 2023

(54) HOT PLATE, SUBSTRATE HEAT-TREATING APPARATUS INCLUDING THE HOT PLATE, AND METHOD OF FABRICATING THE HOT PLATE

(71) Applicant: SEMES Co., Ltd., Chungcheongnam-do (KR)

(72) Inventors: Kyung Sik Shin, Chungcheongnam-do (KR); Man Kyu Kang, Chungcheongnam-do (KR); Jun Ho Kim, Gyeonggi-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 596 days.

(21) Appl. No.: 16/538,105

(22) Filed: Aug. 12, 2019

(65) Prior Publication Data

US 2020/0066555 A1 Feb. 27, 2020

(30) Foreign Application Priority Data

Aug. 21, 2018 (KR) .......................... 10-2018-0097652

(51) Int. Cl.
*H01L 21/67* (2006.01)
*H01L 21/687* (2006.01)
(Continued)

(52) U.S. Cl.
CPC ...... *H01L 21/67103* (2013.01); *B25B 11/005* (2013.01); *H01L 21/68707* (2013.01);
(Continued)

(58) Field of Classification Search
CPC ............ B25B 11/005; H01L 21/67103; H01L 21/6719; H01L 21/67748; H01L 21/6838;
(Continued)

(56) References Cited

U.S. PATENT DOCUMENTS

| | | | |
|---|---|---|---|
| 6,992,270 B2 | 1/2006 | Lee et al. | |
| 2016/0035601 A1 | 2/2016 | Eum et al. | |
| 2018/0286710 A1* | 10/2018 | Jung | ................. H01J 37/32724 |

FOREIGN PATENT DOCUMENTS

| | | | |
|---|---|---|---|
| JP | 10279070 A | | 10/1998 |
| JP | 2004253795 | * | 9/2004 |

(Continued)

OTHER PUBLICATIONS

Korean Notice of Allowance issued in Korean Patent Application No. 10-2020-0063509, dated Nov. 27, 2020, 2 pages.
(Continued)

*Primary Examiner* — Sang Y Paik
(74) *Attorney, Agent, or Firm* — RatnerPrestia

(57) ABSTRACT

A hot plate in which holes are formed in proximity pins. The holes of the proximity pins are connected to vacuum holes to suppress generation of air flow during substrate heat treatment. A substrate heat-treating apparatus including the hot plate, and a method of fabricating the hot plate. The hot plate includes: a body with a heater; a plurality of first holes pass through the body in a downward direction; a plurality of proximity pins formed on the body support the substrate such that the substrate does not contact the top of the body. A plurality of second holes formed in at least some of the proximity pins and pass through the proximity pins in the downward direction from surfaces of the proximity pins. The first and second holes are connected to each other, and a vacuum is created inside the first and second holes to fix the substrate.

8 Claims, 10 Drawing Sheets

(51) Int. Cl.
 *B25B 11/00* (2006.01)
 *H05B 3/26* (2006.01)
(52) U.S. Cl.
 CPC ......... *H01L 21/68742* (2013.01); *H05B 3/26* (2013.01); *H05B 2203/002* (2013.01); *H05B 2203/017* (2013.01)
(58) Field of Classification Search
 CPC ......... H01L 21/68707; H01L 21/68742; H01L 21/6875; H05B 2203/002; H05B 2203/017; H05B 3/26
 USPC .................... 219/443.1, 444.1; 118/724, 725
 See application file for complete search history.

(56) References Cited

FOREIGN PATENT DOCUMENTS

| | | | |
|---|---|---|---|
| JP | 2004282047 | * | 10/2004 |
| JP | 2018010925 | A | 1/2018 |
| KR | 20050020405 | A | 3/2005 |
| KR | 1020060007806 | A | 1/2006 |
| KR | 1020070046303 | A | 5/2007 |
| KR | 1020150035124 | A | 4/2015 |
| KR | 20160017699 | A | 2/2016 |
| KR | 1020180112489 | A | 10/2018 |

OTHER PUBLICATIONS

Korean Office Action for Korean Application No. 10-2018-0097652, dated Oct. 17, 2019, 7 pages.

* cited by examiner

HOT PLATE, SUBSTRATE HEAT-TREATING APPARATUS INCLUDING THE HOT PLATE, AND METHOD OF FABRICATING THE HOT PLATE

CROSS REFERENCE TO RELATED APPLICATION

This application claims the benefit of Korean Patent Application No. 10-2018-0097652, filed on Aug. 21, 2018, in the Korean Intellectual Property Office, the disclosure of which is incorporated herein by reference in its entirety.

BACKGROUND

1. Field

The present disclosure relates to a hot plate used to fabricate a semiconductor device, a substrate heat-treating apparatus including the hot plate, and a method of fabricating the hot plate.

2. Description of the Related Art

To fabricate a semiconductor device, a predetermined pattern should be formed on a substrate such as a wafer. When the predetermined pattern is formed on the substrate, a depositing process, a lithography process, an etching process, etc. may be successively performed.

Of the above processes, in the lithography process, the substrate may be heat-treated in a bake chamber. To heat-treat the substrate in the bake chamber, lift pins may place the substrate on a hot plate. Then, the substrate may be heat-treated. Here, proximity pins may be formed on an upper surface of the hot plate to prevent the substrate from bouncing.

When the substrate is heat-treated, an air flow directed from a space between the proximity pins toward vacuum holes formed in the hot plate may be formed due to the vacuum holes. Due to this air flow, the hot plate may affect the uniformity of a film formed on the substrate. As a result, the film may have a defect.

SUMMARY

Aspects of the present disclosure provide a hot plate in which holes are formed in proximity pins, and the holes of the proximity pins are connected to vacuum holes to suppress the generation of an air flow during heat treatment of a substrate, a substrate heat-treating apparatus including the hot plate, and a method of fabricating the hot plate.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a hot plate including: a body in which a heater for heating a substrate is provided; a plurality of first holes which pass through the body in a downward direction from a top of the body; a plurality of proximity pins which are formed on the body and support the substrate such that the substrate does not contact the top of the body; and a plurality of second holes which are formed in at least some of the proximity pins and pass through the proximity pins in the downward direction from surfaces of the proximity pins, wherein the first and second holes are connected to each other, and a vacuum is created inside the first and second holes to fix the substrate.

The second holes may be connected to the first holes such that the second holes overlap the first holes when seen from above the body.

Proximity pins having the second holes may be located on the first holes, and proximity pins not having the second holes may not be located on the first holes.

The proximity pins may be made of the same material as the body and may be integrally formed with the body.

The proximity pins may be made of a different material from the body and may be inserted and then fixed to grooves formed in the body by using C-rings or E-rings.

According to another aspect of the present disclosure, there is provided a substrate heat-treating apparatus including: a heating unit which heats a substrate using a hot plate; a cooling unit which cools the heated substrate; and a transfer robot which transfers the substrate from the heating unit to the cooling unit, wherein the hot plate includes: a body in which a heater for heating a substrate is provided; a plurality of first holes which pass through the body in a downward direction from a top of the body; a plurality of proximity pins which are formed on the body and support the substrate such that the substrate does not contact the top of the body; and a plurality of second holes which are formed in at least some of the proximity pins and pass through the proximity pins in the downward direction from surfaces of the proximity pins, wherein the first and second holes are connected to each other, and a vacuum is created inside the first and second holes to fix the substrate.

According to another aspect of the present disclosure, there is provided a method of fabricating a hot plate. The method includes: providing a body which is made of a first material and a plurality of proximity pins which are formed on the body to support a substrate and made of the first material; and forming first holes which pass through the body in a downward direction from a top of the body and second holes which pass through the proximity pins in the downward direction from surfaces of the proximity pins, wherein the first and second holes are integrally formed by a single process.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
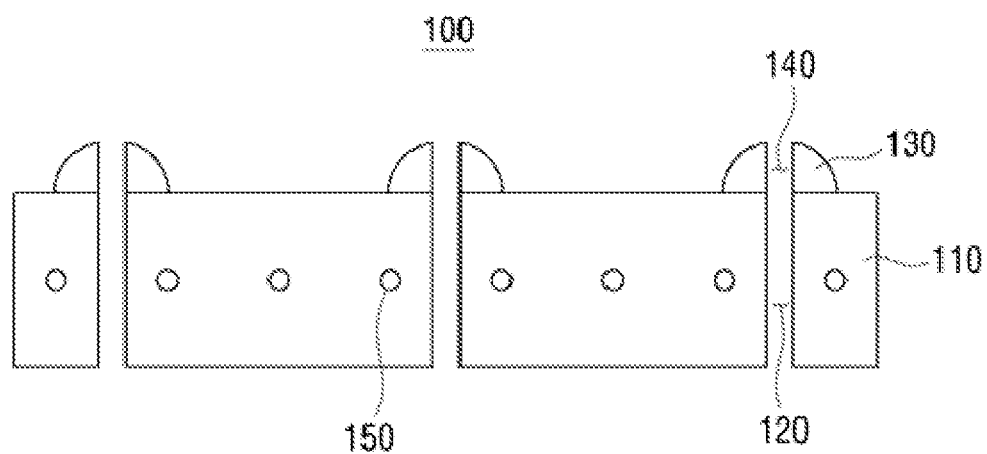
FIG. 1 is a cross-sectional view illustrating the schematic structure of a hot plate according to an embodiment.

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the invention to those skilled in the art, and the present disclosure will only be defined by the appended claims. Like reference numerals refer to like elements throughout the specification.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present.

Spatially relative terms, such as "below," "beneath," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" or "beneath" can encompass both an orientation of above and below. The device may be otherwise oriented and the spatially relative descriptors used herein interpreted accordingly.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in detail with reference to the attached drawings. In the following description with reference to the attached drawings, like or corresponding elements will be indicated by like reference numerals, and a redundant description thereof will be omitted.

The present disclosure relates to a hot plate for suppressing an air flow that causes a defect in a substrate when the substrate is treated with heat. In addition, the present disclosure relates to a substrate heat-treating apparatus including the hot plate. The present disclosure will now be described in detail with reference to the attached drawings.

FIG. 1 is a cross-sectional view illustrating the schematic structure of a hot plate 100 according to an embodiment.

The hot plate 100 applies heat to a substrate when the substrate is heat-treated. According to FIG. 1, the hot plate 100 may include a body 110, a plurality of proximity pins 130, and a plurality of heaters 150.

The body 110 forms the body of the hot plate 100. The body 110 may be cylindrical. However, the current embodiment is not limited to this case. For example, the body 110 may also be formed in a polyhedral shape or in an ellipsoidal shape.

The body 110 may have a greater diameter than a substrate. However, embodiments are not limited to this case. That is, the body 110 may also have the same diameter as the substrate.

The body 110 may be made of a ceramic material such as aluminum oxide ($Al_2O_3$) or aluminum nitride (AlN). However, the current embodiment is not limited to this case, and the body 110 may also be made of a metal material having excellent heat-resisting property or refractoriness.

The body 110 may include a plurality of first holes 120 that pass through the body 110 in a vertical direction. The first holes 120 may be vacuum holes that form vacuum pressure and may fix a substrate in position when the substrate is heat-treated.

The first holes 120 may be circular in cross-section. However, the current embodiment is not limited to this case. For example, the first holes 120 may also be polygonal or elliptical in cross-section.

The proximity pins 130 are formed on the body 110 to prevent a substrate (e.g., a wafer) from bouncing when the substrate is heated using the heaters 150 after being placed on the hot plate 100 by lift pins (not illustrated). That is, the proximity pins 130 may be formed on the body 110 to support a substrate such that the substrate does not contact the top of the body 110. The proximity pins 130 be formed on the body 110, together with the lift pins.

The proximity pins 130 may protrude upward from the top of the body 110. In this case, the proximity pins 130 may be hemispherical. However, the current embodiment is not limited to this case. For example, the proximity pins 130 may also be formed in a pyramidal shape or in a polyhedral shape.

Like the body 110, the proximity pins 130 may be made of a ceramic material such as aluminum oxide ($Al_2O_3$) or aluminum nitride (AlN). However, the current embodiment is not limited to this case, and the proximity pins 130 may also be made of another material having excellent heat-resisting property or refractoriness.

The proximity pins 130 may be made of the same material as the body 110. However, the current embodiment is not limited to this case. That is, the proximity pins 130 may also be made of a material different from that of the body 110.

A plurality of second holes 140 may be formed in the proximity pins 130 to pass through the proximity pins 130 in the vertical direction, respectively. The second holes 140 may be connected to the first holes 120 so that air can pass through the first and second holes 120 and 140. That is, the second holes 140 may overlap the first holes 120 when seen from above the body 110.

When the second holes 140 are connected to the first holes 120, the entire cross-sections of the second holes 140 may be connected to the first holes 120. However, the current embodiment is not limited to this case, and only part of the cross-sections of the second holes 140 can be connected to the first holes 120.

The second holes 140 may have the same size as the first holes 120. In this case, as illustrated in FIG. 1, the entire cross-sections of the second holes 140 may be connected to the first holes 120 having the same size as the second holes 140.

The second holes 140 may also have a different size from the first holes 120. When the second holes 140 are smaller than the first holes 120, the entire cross-sections of the second holes 140 may be connected to the first holes 120. On the contrary, when the second holes 140 are larger than the first holes 120, the entire cross-sections of the first holes 120 may be connected to the second holes 140.

The second holes 140 may be circular in cross-section. However, the current embodiment is not limited to this case. For example, the second holes 140 may also be polygonal or elliptical in cross-section.

The second holes 140 may have the same cross-sectional shape as the first holes 120. However, the current embodiment is not limited to this case. That is, the cross-sectional shape of the second holes 140 may also be different from that of the first holes 120.

The second holes 140 may be formed in some proximity pins 130 provided on the hot plate 100. However, the current embodiment is not limited to this case, and the second holes 140 may also be formed in all proximity pins 130 provided on the hot plate 100 or may be formed in any one proximity pin 130 provided on the hot plate 100.

Figure 2:
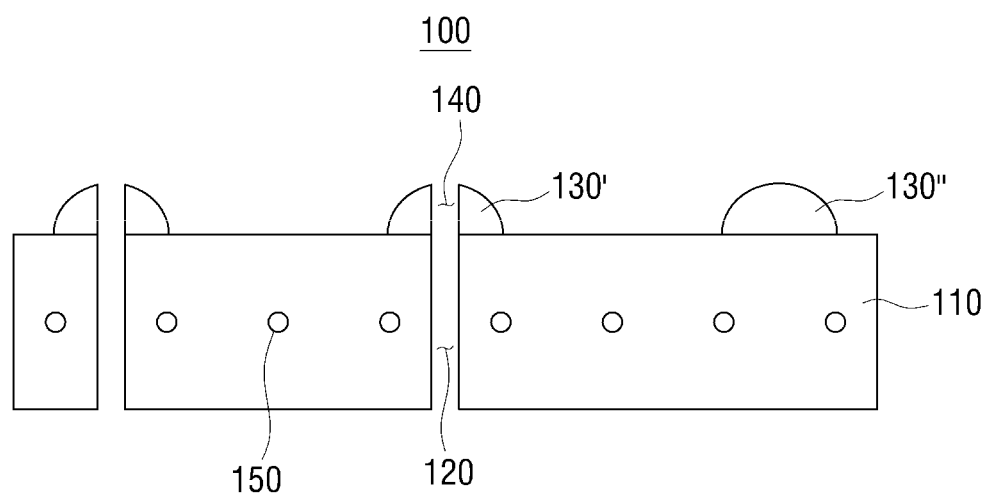
FIG. 2 is a cross-sectional view illustrating the schematic structure of a hot plate according to an embodiment.

When the second holes 140 are formed in some proximity pins 130 provided on the hot plate 100, a proximity pin 130' having a second hole 140 may be located on a first hole 120 as illustrated in FIG. 2. On the other hand, a proximity pin 130" not having a second hole 140 may not be located on a first hole 120. FIG. 2 is a cross-sectional view illustrating the schematic structure of a hot plate 100 according to an embodiment.

Referring back to FIG. 1, the heaters 150 are designed to apply heat to a substrate placed on the lift pins. The heaters 150 may be provided inside the body 110. The heaters 150 may be implemented as heating resistors to which a current is applied. However, the form in which the heaters 150 are implemented is not limited to this form in the current embodiment.

For a lithography process, when a substrate is heat-treated after being lifted by the lift pins of the hot plate 100, the substrate may be fixed by the vacuum pressure formed through the first holes 120. Here, a pressure of about −10 kPa or more may be needed if the substrate has a thickness of less than 400 µm, and a pressure of −25 kPa or more may be needed if the substrate has a thickness of 400 µm to 500 µm.

Figure 3:
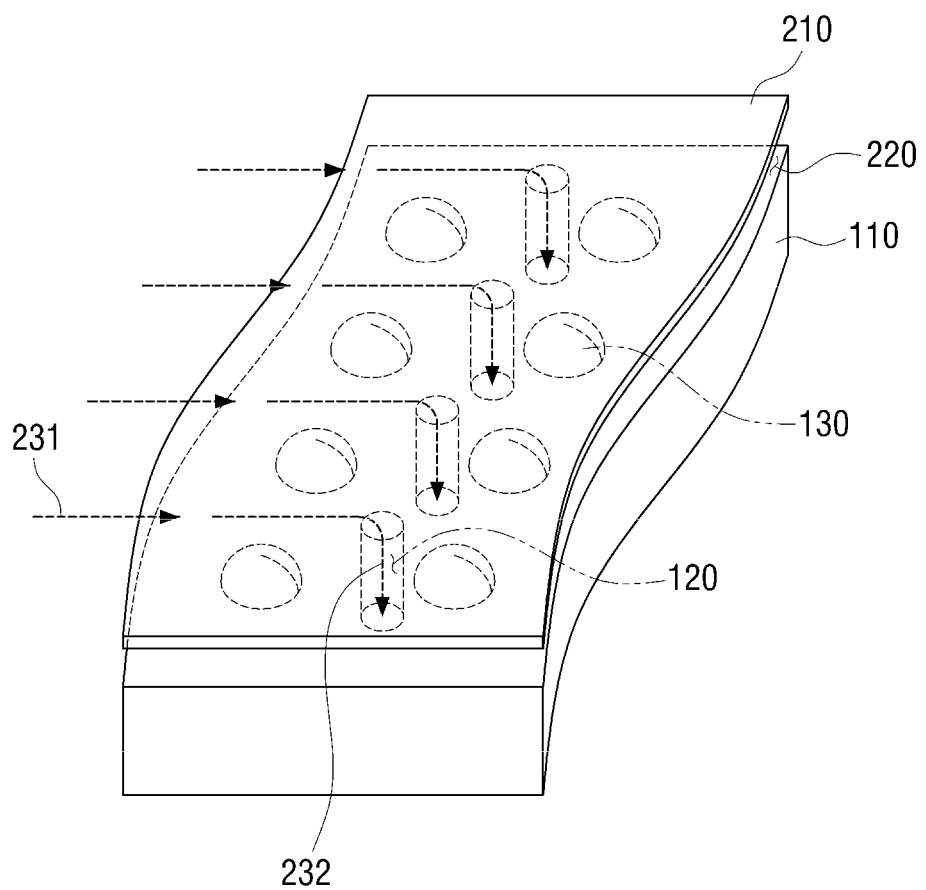
FIG. 3 is a reference view illustrating a case where only first holes are formed in a hot plate.
Figure 4:
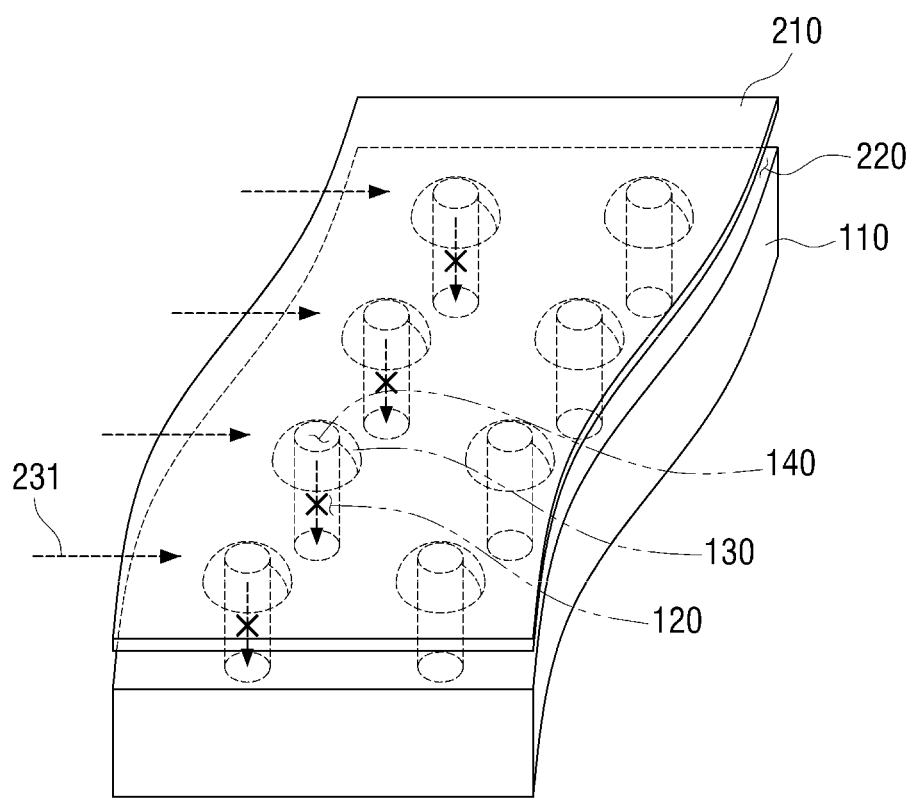
FIG. 4 is a reference view illustrating a case where first and second holes are formed to be connected to each other in a hot plate.

FIGS. 3 and 4 illustrate proximity pins 130, first holes 120, second holes 140, etc. formed in cut portions of hot plates 100.

Referring to FIG. 3, a space 220 is formed between a substrate 210 and the top of a body 110 due to proximity pins 130. Therefore, if first holes 120 are formed in the body 110, a first air flow 231 directed from the outside toward the space 220 and a second air flow 232 directed from the space 220 toward the first holes 120 may be formed.

Since the second air flow 232 causes temperature non-uniformity between an upper part and a lower part of the substrate 210 as described above, it may affect the uniformity of a film formed on the substrate 210.

In the current embodiment, the first holes 120 are formed in the body 110, and the second holes 140 are formed in the proximity pins 130 as illustrated in FIG. 4. In addition, the first holes 120 and the second holes 140 are connected to each other such that air can flow through the first and second holes 120 and 140. In this case, even if a space 220 is formed between a substrate 210 and the top of the body 110, only the first air flow 231 is formed, and the second air flow 232 is hardly formed. Therefore, in the current embodiment, the structure of the hot plate 100 illustrated in FIG. 4 facilitates uniform temperature distribution to every side of a lower part of the substrate 210 and minimizes temperature non-uniformity between an upper part and the lower part of the substrate 210.

The proximity pins 130 may be made of the same material as the body 110 as described above or may be made of a different material from the body 110. A method of fabricating the hot plate 100 when the proximity pins 130 are made of the same material as the body 110 and a method of fabricating the hot plate 100 when the proximity pins 130 are made of a different material from the body 110 will now be described.

Figure 5:
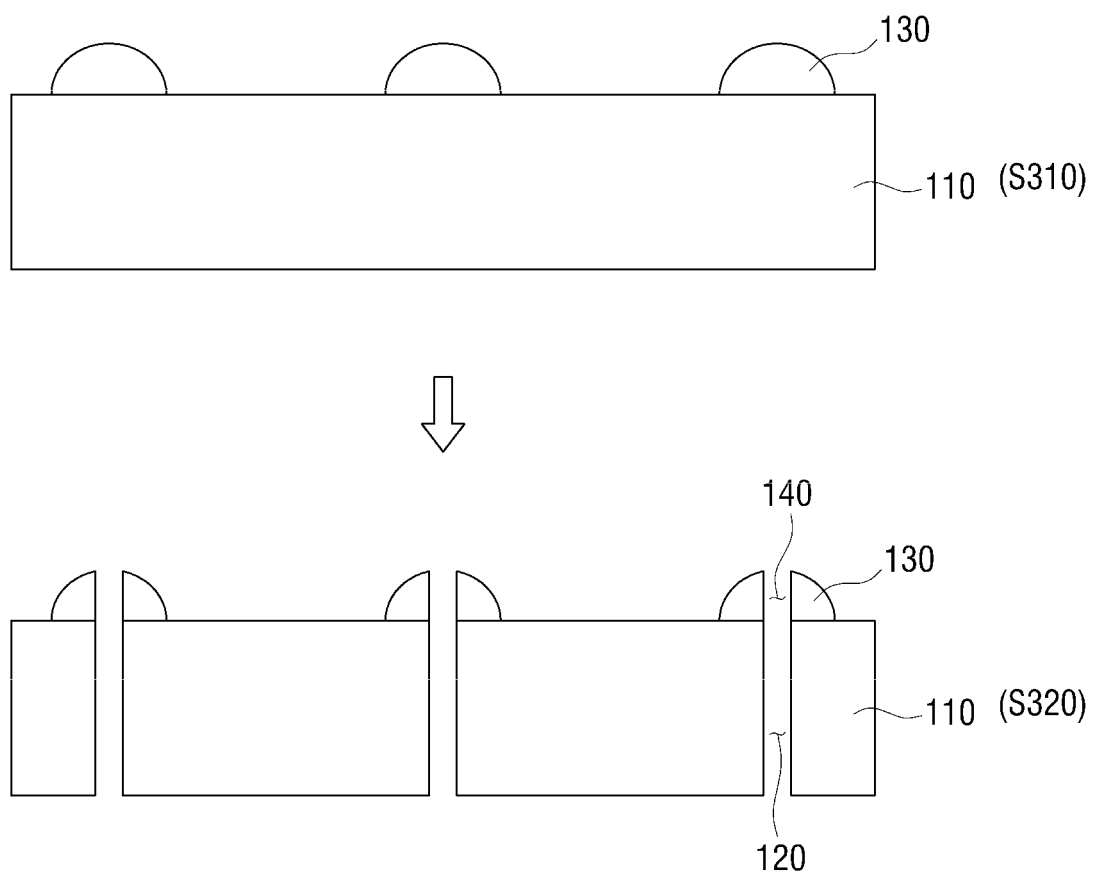
FIG. 5 is a flowchart illustrating a method of fabricating a hot plate when proximity pins are made of the same material as a body.

First, the former case will be described. FIG. 5 is a flowchart illustrating a method of fabricating a hot plate when proximity pins are made of the same material as a body. The following description will be given with reference to FIG. 5.

First, a body 110 is prepared, and a plurality of proximity pins 130 are formed on an upper surface of the body 110, thereby fabricating the body 110 having the proximity pins 130 (operation S310). Here, the body 110 may be made of a ceramic material, but the current embodiment is not limited to this case.

Next, holes are formed to pass through the body 110 from surfaces of the proximity pins 130, thereby fabricating a hot plate 100 having first holes 120 and second holes 140 (operation S320). In the current embodiment, when the body 110 and the proximity pins 130 are made of the same material, the first holes 120 and the second holes 140 may be integrally formed at a time.

Figure 6:
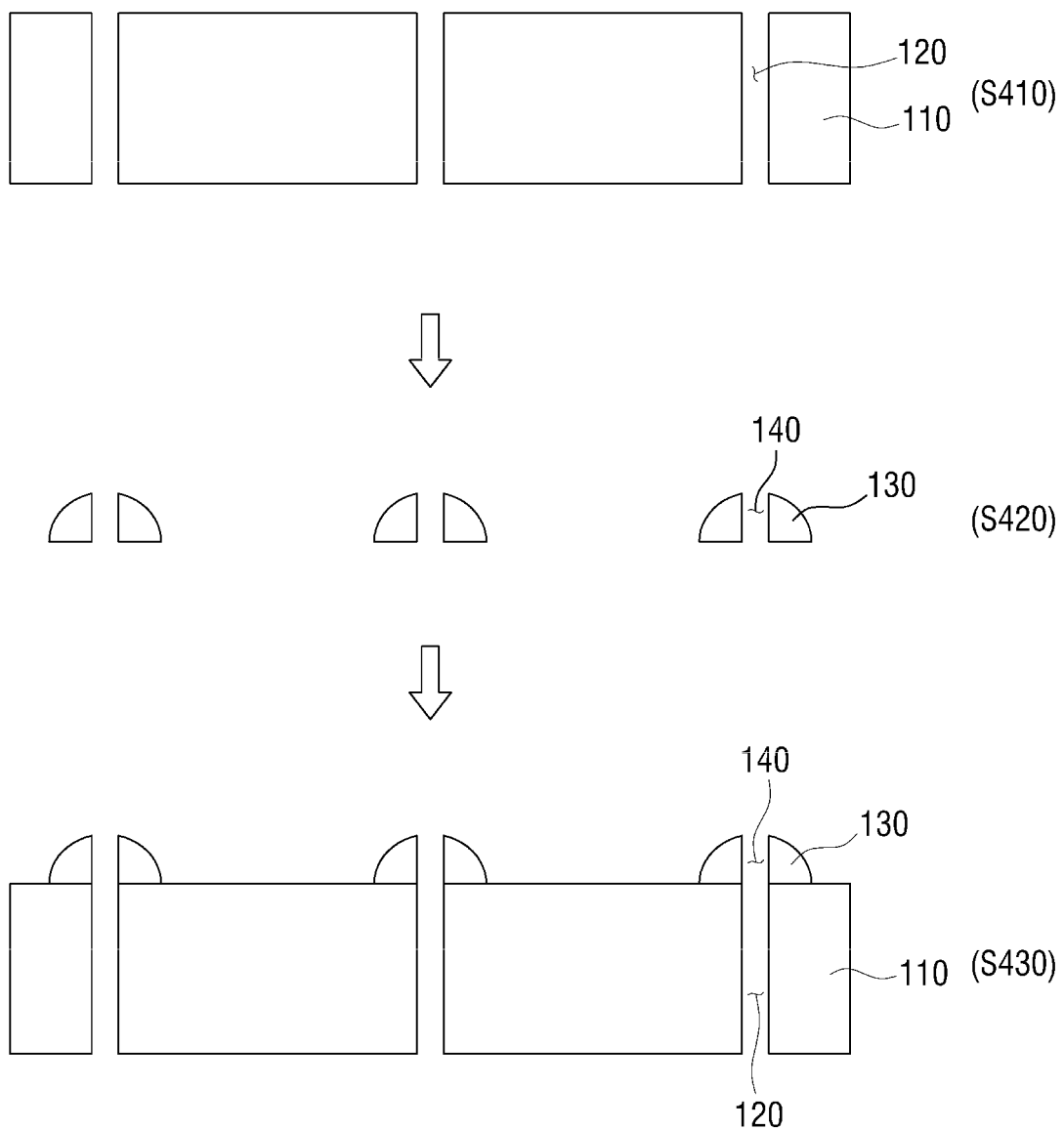
FIG. 6 is a flowchart illustrating a method of fabricating a hot plate when proximity pins are made of a different material from a body.

Next, the latter case will be described. FIG. 6 is a flowchart illustrating a method of fabricating a hot plate when proximity pins are made of a different material from a body. The following description will be given with reference to FIG. 6.

First, a body 110 is prepared, and a plurality of first holes 120 are formed in the body 110, thereby fabricating the body 110 having the first holes 120 (operation S410).

In the current embodiment, proximity pins 13 may be made of a ceramic material. In this case, the body 110 may be made of a metal material, for example, a metal material having excellent heat-resisting property or refractoriness.

Next, the proximity pins 130 are prepared, and second holes 140 are formed in the proximity pins 130, thereby fabricating the proximity pins 130 having the second holes 140 (operation S420).

When the second holes 140 are formed in the proximity pins 130, a radius of the second holes 140 may be set to be half a radius of the proximity pins 130. However, the current embodiment is not necessarily limited to this case. In the current embodiment, a ratio of the radius of the second holes 140 to the radius of the proximity pins 130 may be adjusted according to heating temperature used when the hot plate 100 applies heat to a substrate 210, characteristics of the substrate 210, and the like.

The fabricating of the proximity pins 130 having the second holes 140 (operation S420) may be performed after the fabricating of the body 110 having the first holes 120 (operation S410). However, the current embodiment is not necessarily limited to this case. For example, the fabricating of the proximity pins 130 having the second holes 140 (operation S420) may be performed at the same time as the fabricating of the body 110 having the first holes 120 (operation S410) or before the fabricating of the body 110 having the first holes 120 (operation S410).

After the body 110 having the first holes 120 and the proximity pins 130 having the second holes 140 are fabricated, the proximity pins 130 are coupled onto the body 110 so that the first holes 120 and the second holes 140 overlap and are connected to each other (operation S430).

The proximity pins 130 may be coupled onto the body 110 by forming grooves in upper parts of the first holes 120 and inserting the proximity pins 130 into the grooves. Here, the proximity pins 130 may be fixed to the grooves using C-rings, E-rings, or the like. Accordingly, the proximity pins 130 may be physically joined to the body 110.

In the current embodiment, however, the method of coupling the proximity pins 130 onto the body 110 is not limited to this method. For example, the proximity pins 130 may also be coupled onto the body 110 using various methods of joining ceramics and metals, such as a metallization method, a process bonding method, an active metal method, a high-pressure casting method (SQ bonding method), and a solid-state bonding method.

The methods of fabricating a hot plate have been described above. The method of fabricating a hot plate may be summarized as follows.

First, a body made of a first material and a plurality of proximity pins formed on the body to support a substrate and made of the first material are provided.

Then, first holes passing through the body in a downward direction from a top of the body and second holes passing through the proximity pins in the downward direction from surfaces of the proximity pins are formed. Here, the first and second holes are integrally formed by a single process.

A lithography process may be sequentially performed in the order of a coating process, an exposure process, and a development process. The coating process refers to a process of forming a photoresist layer on a substrate by coating a photoresist on the substrate, and the exposure process refers to a process of forming a circuit by transferring a pattern to the photoresist layer. In addition, the development process refers to a process of selectively removing exposed regions, etc. by supplying a developer to the photoresist layer.

The substrate may be heat-treated in a substrate heat-treating apparatus (e.g., a bake chamber) before or after the coating process (i.e., before or after the photoresist is coated on the substrate), before or after the exposure process (i.e., before or after the developer is supplied onto the substrate), or the like.

Figure 7:
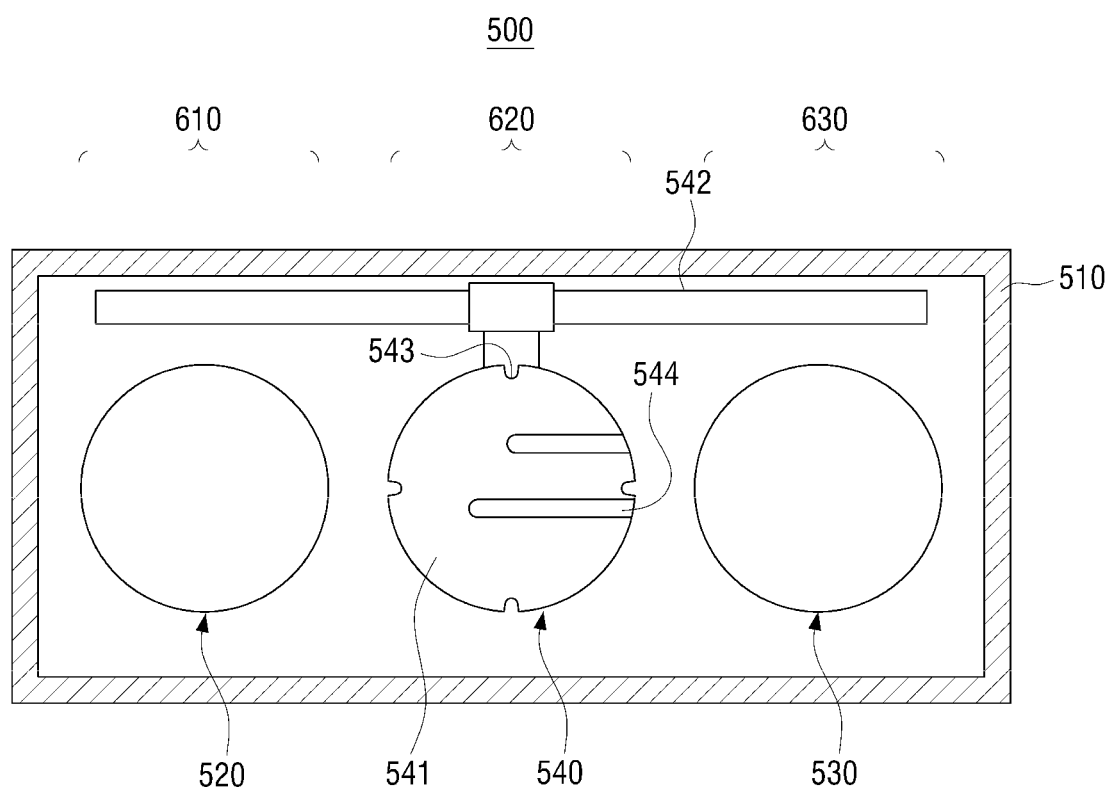
FIG. 7 is a plan view illustrating the schematic structure of a substrate heat-treating apparatus including a hot plate according to an embodiment.
Figure 8:
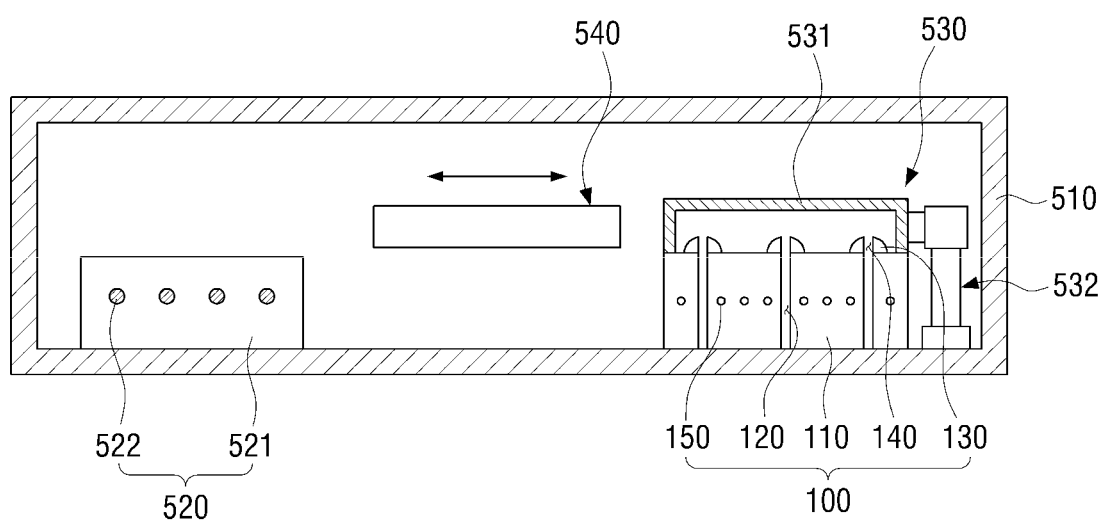
FIG. 8 is a front view illustrating the schematic structure of the substrate heat-treating apparatus including the hot plate according to the embodiment.

A substrate heat-treating apparatus for heat-treating a substrate using the hot plate 100 will now be described. FIG. 7 is a plan view illustrating the schematic structure of a substrate heat-treating apparatus 500 including a hot plate 100 according to an embodiment. FIG. 8 is a front view illustrating the schematic structure of the substrate heat-treating apparatus 500 including the hot plate 100 according to the embodiment.

Referring to FIGS. 7 and 8, the substrate heat-treating apparatus 500 may include a housing 510, a cooling unit 520, a heating unit 530, and a transfer robot 540.

The housing 510 may accommodate the cooling unit 520, the heating unit 530, and the transfer robot 540 to treat a substrate with heat. An opening (not illustrated) through which a substrate is inserted into or removed from the housing 510 may be formed in a sidewall of the housing 510.

One opening may be provided in the housing 510. However, two or more openings can also be provided. The opening may be kept open, and a door (not illustrated) for opening or closing the opening can be provided on the sidewall of the housing 510.

The inside of the housing 510 may be divided into a cooling region 610, a buffer region 620, and a heating region 630. Here, the cooling region 610 refers to a region where the cooling unit 520 is disposed, and the heating region 630 refers to a region where the heating unit 530 is disposed. The cooling region 610 may have the same width as the cooling unit 520 but may also have a greater width than the cooling unit 520. Likewise, the heating region 630 may have the same width as the heating unit 530 but may also have a greater width than the heating unit 530.

The buffer region 620 refers to a region where a transfer plate 541 is disposed when it is in its original position. The buffer region 620 may have a greater width than the transfer plate 541. When the buffer region 620 is provided as described above, the cooling unit 520 and the heating unit 530 may be spaced apart by a sufficient distance. Thus, the cooling unit 520 and the heating unit 530 may be prevented from thermally interfering with each other. However, if the cooling region 610 and the heating region 630 are wider than the cooling unit 520 and the heating unit 530, respectively, the buffer region 620 may have the same width as the transfer plate 541.

In the current embodiment, the above regions 610 through 630 may be arranged inside the housing 510 in the order of the cooling region 610, the buffer region 620, and the heating region 630 from left to right. However, the regions 610 through 630 may also be arranged inside the housing 510 in the order of the heating region 630, the buffer region 620, and the cooling region 610 from left to right.

The cooling unit 520 is designed to cool a substrate heated by the heating unit 530 and may include a cooling plate 521 and a plurality of (?) cooling members 522.

When the heating unit 530 applies high-temperature heat to a substrate, the substrate may warp. Therefore, in the current embodiment, the cooling unit 520 is used to cool the substrate heated by the heating unit 530 so as to restore the substrate to its original state.

The cooling plate 521 may be circular when seen from above. However, the current embodiment is not limited to this case, and the cooling plate 521 may also be formed in an elliptical shape or a polygonal shape.

The cooling members 522 may be formed inside the cooling plate 521. The cooling members 522 may be provided as passages through which a cooling fluid flows inside the cooling plate 521.

The heating unit 530 is designed to heat a substrate and may include the hot plate 100, a cover 531, and a driver 532.

Since the hot plate 100 has been described above with reference to FIGS. 1 through 6, a detailed description thereof is omitted here.

The cover 531 is formed to cover the top of the hot plate 100 when the hot plate 100 heats a substrate. The cover 531 is moved up or down under the control of the driver 532 to cover the top of the hot plate 100.

The driver 532 moves the cover 531 upward or downward. When a substrate to be heated is placed on an upper surface of the hot plate 100, the driver 532 may move the cover 531 downward so that the cover 531 can completely cover the top of the hot plate 100. In addition, when the heating of the substrate ends, the driver 532 moves the cover 531 upward to expose the top of the hot plate 100 so that the transfer robot 540 can transfer the substrate to the cooling unit 520.

The heating unit 530 may improve an adhesion rate of photoresist to a substrate by supplying gas during the heating of the substrate. To this end, the heating unit 530 may use hexamethyldisilane gas.

The transfer robot 540 is designed to transfer a substrate to the heating unit 530 so as to heat the substrate. In addition, the transfer robot 540 transfers a heated substrate from the heating unit 530 to the cooling unit 520 so as to cool the heated substrate.

A hand of the transfer robot 540 may be coupled to the transfer plate 541 in order to transfer a substrate sequentially to the heating unit 530 and the cooling unit 520 and may transfer the transfer plate 541 to the heating unit 530 and the cooling unit 520 along a guide rail 542.

The transfer plate 541 may be disc-shaped and may have a diameter corresponding to that of a substrate. The transfer plate 541 may have a plurality of notches 543 formed at its rim, and a plurality of slit-shaped guide grooves 544 may be formed in a surface of the transfer plate 541.

Figure 9:
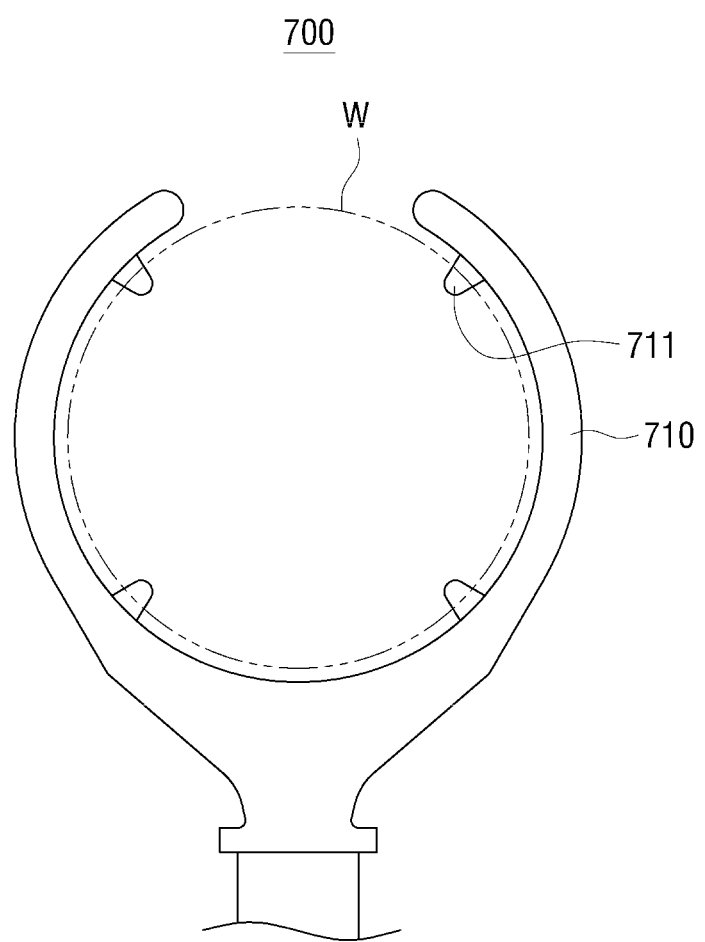
FIG. 9 schematically illustrates a hand of a substrate transfer robot which transfers a substrate to the substrate heat-treating apparatus.
Figure 10:
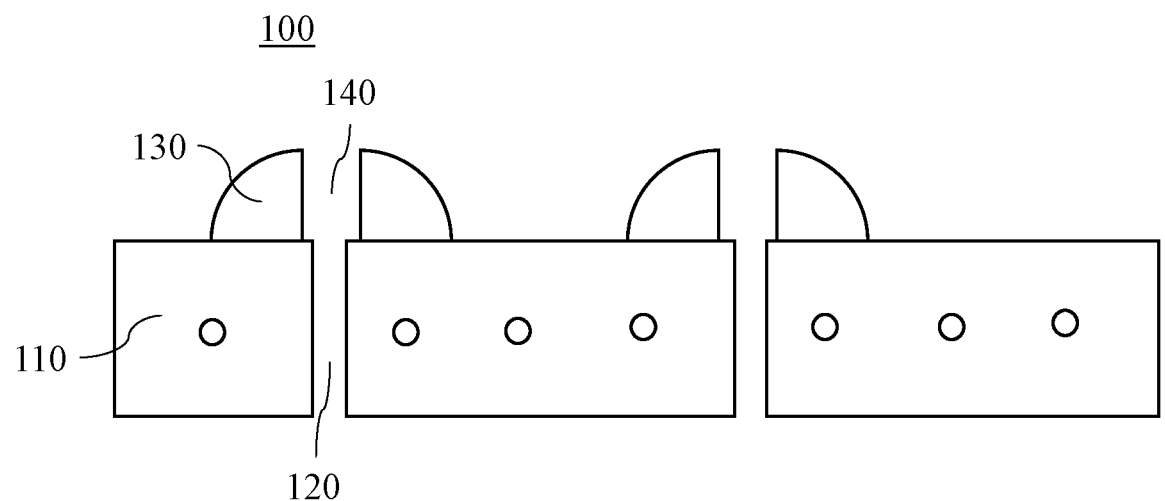
FIG. 10 is a cross-sectional view illustrating the schematic structure of a hot plate according to an embodiment.

The transfer robot 540 may receive a substrate from a substrate transfer robot 700 outside the housing 510 through the opening of the housing 510. FIG. 9 schematically illustrates a hand 710 of the substrate transfer robot 700 which transfers a substrate to the substrate heat-treating apparatus 500.

Referring to FIG. 9, a plurality of protrusions 711 are formed on the hand 710 of the substrate transfer robot 700. The notches 543 of the transfer plate 541 may have a shape corresponding to the shape of the protrusions 711 and may be formed at positions corresponding to the positions of the protrusions 711. In addition, a corresponding number of the notches 543 as the number of the protrusions 711 may be provided.

In a state where the hand 710 of the substrate transfer robot 700 and the transfer plate 541 are aligned in the vertical direction, if the vertical positions of the hand 710 of the substrate transfer robot 700 and the transfer plate 541 are changed, a substrate may be transferred between the hand 710 of the substrate W transfer robot 700 and the transfer plate 541.

The guide grooves 544 may extend from the rim of the transfer plate 541 into the transfer plate 541. Here, the guide grooves 544 may be spaced apart from each other along the same direction. When the substrate W is transferred between the transfer plate 541 and the heating unit 530, the guide grooves 544 may prevent the transfer plate 541 and lift pins from interfering with each other.

The substrate W may be heated in a state where the substrate W is placed directly on the hot plate 100 and may be cooled in a state where the transfer plate 541 on which the substrate W is placed is in contact with the cooling plate 521. The transfer plate 541 may be made of a material having excellent heat transfer efficiency in order to facilitate heat transfer between the cooling plate 521 and the substrate W. For example, the transfer plate 541 may be made of a metal material.

While the present disclosure has been particularly shown and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:
1. A hot plate comprising:
a body in which a heater for heating a substrate is provided;
a plurality of first holes which pass through the body in a downward direction from a top of the body;
a plurality of proximity pins which are formed on the body and support the substrate such that the substrate does not contact the top of the body; and
a plurality of second holes which are formed in respective ones of the plurality of proximity pins and pass through the proximity pins in the downward direction from surfaces of the proximity pins,
wherein each of the plurality of first holes is connected to a respective one of the plurality of second holes, and a vacuum is created inside the first and second holes to fix the substrate,
wherein the body lacks any hole other than the plurality of first holes that is connected to the vacuum and passes through the body in the downward direction from the top of the body, and
wherein the second holes are connected to the first holes such that the second holes overlap with the first holes in an axial direction of the second holes, the overlap covering less than an entire cross-sectional area of the second holes.

2. The hot plate of claim 1, wherein proximity pins having the second holes are located on the first holes, and proximity pins not having the second holes are not located on the first holes.

3. The hot plate of claim 1, wherein the proximity pins are made of the same material as the body and are integrally formed with the body.

4. The hot plate of claim 1, wherein the proximity pins are made of a different material from the body and are inserted and then fixed to grooves formed in the body.

5. The hot plate of claim 1, wherein the second holes have a different cross-sectional area than the first holes.

6. The hot plate of claim 1, wherein the second holes open at an uppermost point of the fewer than all of the proximity pins.

7. A substrate heat-treating apparatus comprising:
a heating unit which heats a substrate using a hot plate;
a cooling unit which cools the heated substrate; and
a transfer robot which transfers the substrate from the heating unit to the cooling unit,
wherein the hot plate comprises:

a body in which a heater for heating a substrate is provided;
a plurality of first holes which pass through the body in a downward direction from a top of the body;
a plurality of proximity pins which are formed on the body and support the substrate such that the substrate does not contact the top of the body; and
a plurality of second holes which are formed in respective ones of the plurality of proximity pins and pass through the proximity pins in the downward direction from surfaces of the proximity pins,
wherein each of the plurality of first holes is connected to a respective one of the plurality of second holes, and a vacuum is created inside the first and second holes to fix the substrate,
wherein the body lacks any hole other than the plurality of first holes that is connected to the vacuum and passes through the body in the downward direction from the top of the body, and
wherein the second holes are connected to the first holes such that the second holes overlap with the first holes in an axial direction of the second holes, the overlap covering less than an entire cross-sectional area of the second holes.

8. A method of fabricating a hot plate, the method comprising:
providing a body which is made of a first material and a plurality of proximity pins which are formed on the body to support a substrate and made of the first material; and
forming first holes which pass through the body in a downward direction from a top of the body and second holes which pass through respective ones of the plurality of proximity pins in the downward direction from surfaces of the proximity pins,
wherein each of the plurality of first holes is integrally formed with a respective one of the plurality of second holes by a single process,
wherein the body lacks any hole other than the plurality of first holes that passes through the body in the downward direction from the top of the body, and
wherein the second holes are connected to the first holes such that the second holes overlap with the first holes in an axial direction of the second holes, the overlap covering less than an entire cross-sectional area of the second holes.

* * * * *